(12) United States Patent
Geyer (10) Patent No.: US 7,288,426 B2
(45) Date of Patent: Oct. 30, 2007

(54) AUTOMATICALLY ADJUSTING SERIAL CONNECTIONS OF THICK AND THIN LAYERS AND METHOD FOR THE PRODUCTION THEREOF

(75) Inventor: Volker Geyer, Niederkrüchten (DE)

(73) Assignee: Scheuten Glasgroep, Venlo (NL)

( * ) Notice: Subject to any disclaimer, the term of this patent is extended or adjusted under 35 U.S.C. 154(b) by 389 days.

(21) Appl. No.: 10/508,195

(22) PCT Filed: Mar. 18, 2003

(86) PCT No.: PCT/EP03/02865

§ 371 (c)(1),
(2), (4) Date: Sep. 18, 2004

(87) PCT Pub. No.: WO03/079432

PCT Pub. Date: Sep. 25, 2003

(65) Prior Publication Data

US 2005/0173238 A1 Aug. 11, 2005

(30) Foreign Application Priority Data

Mar. 19, 2002 (EP) .................................. 02006161

(51) Int. Cl.
*H01L 21/283* (2006.01)
*H01L 23/52* (2006.01)
*H01L 27/142* (2006.01)

(52) U.S. Cl. ..................... 438/63; 438/80; 438/98; 438/763; 438/944; 257/448; 257/461; 257/E31.124; 257/E37.125; 136/256

(58) Field of Classification Search .................. 438/63, 438/80, 98, 763, 944, FOR. 240; 257/448, 257/461, E31.124, E27.125, E37.125; 136/250, 136/256

See application file for complete search history.

(56) References Cited

U.S. PATENT DOCUMENTS

| 6,313,905 | B1* | 11/2001 | Brugger et al. ............... 355/55 |
| 6,716,656 | B2* | 4/2004 | Shtein et al. .................. 438/24 |
| 2001/0032666 | A1* | 10/2001 | Jenson et al. ............... 136/256 |
| 2003/0207505 | A1* | 11/2003 | Theiss et al. ............... 438/158 |
| 2005/0000561 | A1* | 1/2005 | Baret et al. .................. 136/244 |

FOREIGN PATENT DOCUMENTS

| DE | 37 27 825 A | 3/1989 |
| EP | A O 853 345 | 7/1998 |
| WO | WO 96/30935 A | 10/1996 |

* cited by examiner

Primary Examiner—George Fourson
(74) Attorney, Agent, or Firm—Richard Aron Osman

(57) ABSTRACT

The invention relates to a method for the production of automatically adjusting serial connections of thick and/or thin layers. The method comprises the following process steps: applying electrically conductive strip conductors (20) to a substrate (10); applying a first main layer (30) at an angle a relative to the surface of the substrate; applying a second main layer which is made of granular-shaped particles (40) to the substrate (10); applying several layers in conjunction with material and process-dependent processing steps; applying a third main layer (70) at an angle β relative to the surface of the substrate; and applying a fourth main layer (80) at an angle y relative to the surface of the substrate.

40 Claims, 8 Drawing Sheets

AUTOMATICALLY ADJUSTING SERIAL CONNECTIONS OF THICK AND THIN LAYERS AND METHOD FOR THE PRODUCTION THEREOF

FIELD OF THE INVENTION

The invention relates to a self-adjusting serial connection of thick and thin layers and a method for the production thereof.

BACKGROUND OF THE INVENTION

In industry, there is an increasing need for methods for the production of series connections of thick and thin layers, but especially in the realm of photovoltaics, the problem of serial connection of thick-layer and thin-layer cells has not yet been solved satisfactorily.

The best-known method for the production of serial connections of thin layers is the application of the individual layers, interrupted by process steps in which the applied layer is separated by a laser or by mechanical means. Typically, several processing steps are needed for this in which each applied layer is provided with interruptions in the form of separating cuts.

Such production methods have various disadvantages. Since the cuts, in order to minimize dead surfaces, have to lie very close to each other but must not overlap or intersect with each other because this would otherwise cause short circuits or errors, an extremely precise orientation of the substrate, for example, is necessary. Moreover, in order to effectuate an inline process, an appropriate station has to be set up for each cut that is to be made. In contrast, if the method is not carried out in an inline process, then the substrate has to be transported to a cutting station for each cut.

International patent application WO 96/30935 discloses a method for the production of multilayer electronic components with which electrically conductive and insulating layers are applied alternately. Here, a substrate is used on whose surface there are webs having a rectangular cross section so that an oriented layer deposition at an incident angle causes a shading of areas between the webs.

European patent application EP 0 853 345 A1 describes a method for the formation of CdTe layers during the production of solar cells. The CdTe layers are applied by means of sublimation processes, whereby the material source for such a process is configured in such a way that a powder of CdTe powder and other constituents is mixed to form a paste that is applied Onto a substrate. This source substrate is arranged at a fixed distance opposite from a substrate to be coated such that when the source substrate is heated up a CdTe layer is formed on the opposite substrate.

German Preliminary Published Application No. 37 27 825 A1 discloses a method for the production of a serially connected thin layer solar module made of crystalline silicon, with which narrow webs are applied onto a substrate having a large surface area and these webs are coated consecutively with different functional layers. In order to keep certain areas free of deposition material of a layer, for example, masks as well as etching, polishing, etching or laser techniques are used.

SUMMARY OF THE INVENTION

The objective of the invention is to refine a method of the generic type for the production of self-adjusting serial connections of thick and/or thin layers in such a way as to avoid the drawbacks of conventional production methods and to have just a few process steps that are easy to carry out.

Moreover, it is the objective of the invention to provide a self-adjusting serial connection of thick and/or thin layers that can be produced by just a few process steps that are as easy as possible to carry out.

According to the invention, this objective is achieved in that electrically conductive conductor tracks are applied onto a substrate and the substrate is exposed to several layer depositions of conductive, semiconductive and/or insulating materials that are applied at different angles of incidence.

When the layer depositions are applied at the various angles, different areas between the conductor tracks are shaded and are thus not exposed to the material deposition in question.

The objective is also achieved in that, in addition to the layer depositions at an angle, additional layers are applied which include especially a main layer of granular particles.

This layer of grains is the semiconductor of the serial connection and is to be designated as the thick layer since it has a thickness in the order of magnitude of 10 µm to 200 µm, in contrast to the applied thin layers that have a thickness in the order of magnitude of 50 nm to 50 µm. The series connection resulting from the method according to the invention is thus a connection of thick and thin layers through which a current can flow.

The conductors tracks applied onto the substrate preferably have a rectangular cross section, but other cross section geometries are also possible. For example, the conductor tracks can have a triangular, trapezoidal or round cross section. The conductor tracks are applied onto the surface of a substrate which can be, for instance, glass. After the application of the conductor tracks, the substrate is exposed consecutively to various coating procedures and processing steps. These include at least several layer depositions at an application angle relative to the surface of the substrate and the formation of a semiconductor layer by means of the application of granular particles.

The direction of the deposition in question is preferably at an angle perpendicular to the lengthwise orientation of the conductor tracks and at an angle relative to the surface of the substrate so that, between the conductor tracks, areas are formed that are shaded by the conductor track flanks and are thus not exposed to deposition.

In an especially preferred embodiment of the invention, in order to create a serial connection of thick and thin layers, at least three main layers are applied at different angles relative to the surface of the substrate as well as one layer of grains. The main layers can consist of several individual layers that are preferably applied at the same angle as the layer in question. Furthermore, the main layers can be interrupted or augmented by additional layers and processing steps that are needed to create a serial connection.

An especially preferred embodiment of a serial connection consisting of four main layers will be described below, whereby three main layers are applied at an angle and one main layer consists of grains. The four main layers are augmented by additional layers that are necessary to create a serial connection of the layers. For this purpose, electrically conductive conductor tracks are applied onto a substrate, after which the first main layer is applied. This layer is a back contact made of a conductive or semiconductive adhesive. This first deposition at a first angle of incidence α results in a coating of the substrate, of a flank and of the top of a conductor track, whereby a certain area behind the conductor tracks is not coated with the adhesive. At a certain distance behind the conductor tracks, a coating of the substrate is carried out once again, continuing on the flank of the next conductor track. The selection of the angle of incidence of the deposition depends on the size of the granular particles that are to be applied later. In order for no grains to come in contact with and adhere to the shaded side of the conductor track in question, the shaded area has to be at least as large as the diameter of a grain.

The second main layer is a semiconductor layer that is created by applying granular particles. The grains are applied onto the adhesive layer that is not yet fully hardened and they adhere there. In order to achieve an insulation between the grains, an insulating polymer layer is applied in the interstices between the grains. This can be done, for example, by dipping or spraying methods.

In order to create a p/n transition, it is now necessary to apply an n-conductive layer. This buffer layer can be, for example, cadmium sulfide that is applied by the method of chemical bath deposition. If other materials are used for the n-conductive layer, it is also possible to employ methods such as sputtering (PVD), chemical vapor deposition (CVD) and atomic layer deposition (ALD).

After the n-conductive layer, a third main layer is applied at an angle γ. This is an intrinsic layer whose main constituent in an especially preferred embodiment of the invention is ZnO.

After the intrinsic layer comes another layer deposition at an angle γ relative to the surface of the substrate. This third main layer is a conductive front contact.

Through the described repetition of layer depositions at different angles and the application of the semiconductor layer in the form of grains, a serial connection of thick and/or thin layers is created that is especially well-suited for use in solar cells.

The described method for the production of self-adjusting serial connections of thick and thin layers is characterized by various advantages in comparison to conventional methods. For one thing, there is no need for an absolutely precise orientation of the substrate to be coated since the shading area determines the separation areas. Secondly, by using suitable application means, the shading width and thus the non-active area can be reduced to a minimum. Moreover, the method can readily be carried out in an inline process since the substrate does not have to be transported back and forth between individual processing stations but rather can be processed at one single station with suitable application means. It is not possible for the separation areas to cross, so that error sources and short circuits are ruled out.

In comparison to conventional thin layers, especially the use of a thick layer in the form of granular particles has the advantage that the grains can be created as individual crystals, something which results in better electrical properties. Furthermore, through the employed method, the high-temperature and low-temperature steps of conventional thin layer photovoltaics are separated, which leads to greater flexibility.

Additional advantages, special features and advantageous refinements of the invention ensue from the subordinate claims and from the presentation below of preferred embodiments with reference to the figures.

DETAILED DESCRIPTION OF EMBODIMENTS OF THE INVENTION

Figure 1:
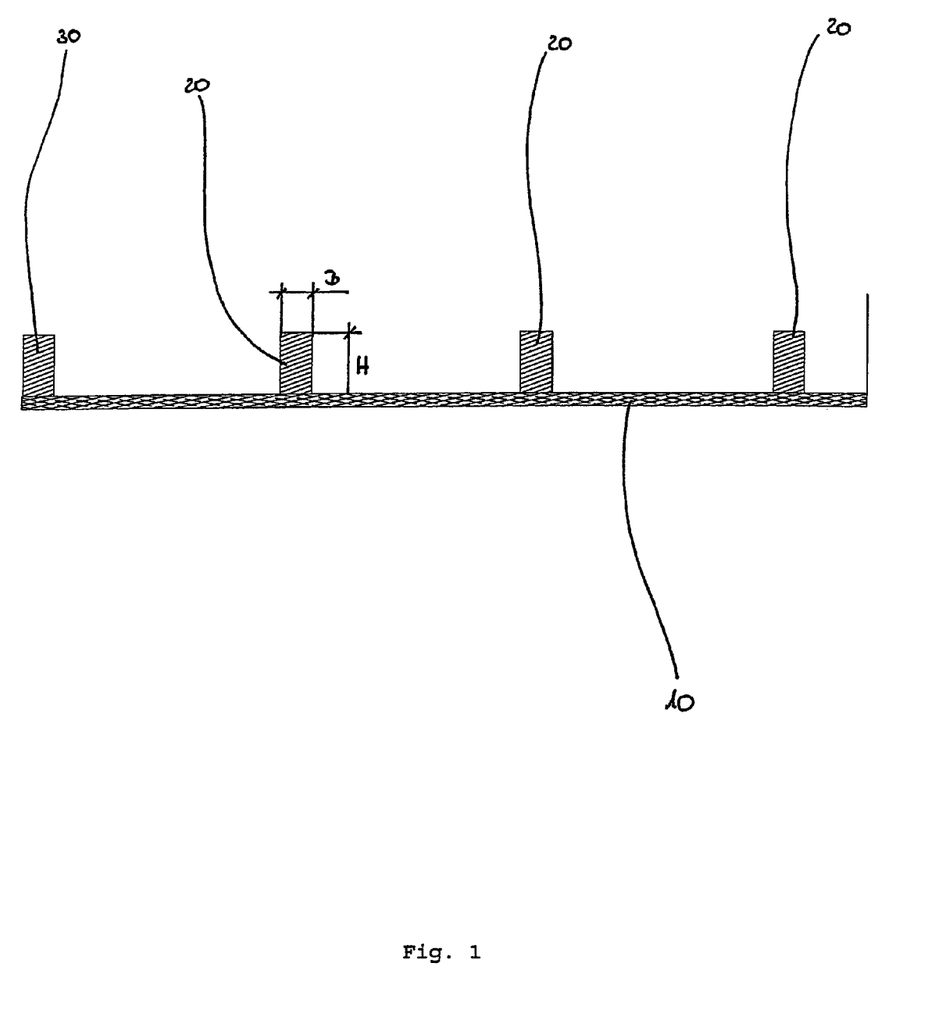
FIG. 1 an embodiment of a substrate with applied conductor tracks.

FIG. 1 shows a substrate 10 onto which several conductor tracks 20 running essentially parallel to each other were applied. Here, the expression "essentially" means conductor tracks that run exactly parallel as well as conductor tracks that diverge from the parallel by up to 50% of the distance between the conductor tracks. The substrate can be, for example, glass, especially float glass. Another suitable substrate is polymer film. The conductor tracks 20 are electrically conductive and can be made of conductive polymer compounds, conductive glass frits, metallic wires or other materials. The cross section of the conductor tracks is preferably rectangular, but other cross sections can also be chosen. For example, the conductor tracks can have a triangular, trapezoidal or round cross section. The triangular conductor tracks can be applied in such a way that a side surface is joined to the surface of the substrate. Trapezoidal conductor tracks can be applied, for example, in such a way that the cross section tapers towards the surface of the substrate.

The conductor tracks can be applied, for example, by means of silk screen printing, whereby the width W of the tracks is determined by the screen and by the properties of the paste employed, whereas the height H is determined primarily by the number of printing procedures. The silk screen printing can be carried out, for example, with graphite and/or silver paste. If the conductor tracks are metallic strips, they can be glued onto the substrate, for instance, with a conductive adhesive.

The resulting dimensions of the conductor tracks are advantageously in the following orders of magnitude: width W=10 μm to 500 μm and height H=5 μm to 500 μm. The length of the conductor tracks can be selected as desired and depends primarily on the dimensions of the substrate to be coated. Accordingly, conductor tracks with lengths in the order of magnitude of 30 cm to 6 meters are used. Therefore, the number of applied conductor tracks can likewise be selected as desired, whereby it preferably lies in the range from 50 to 200 per meter. The distance between the individual conductor tracks 20 is established as a function of the selected dimensions.

Figure 2:
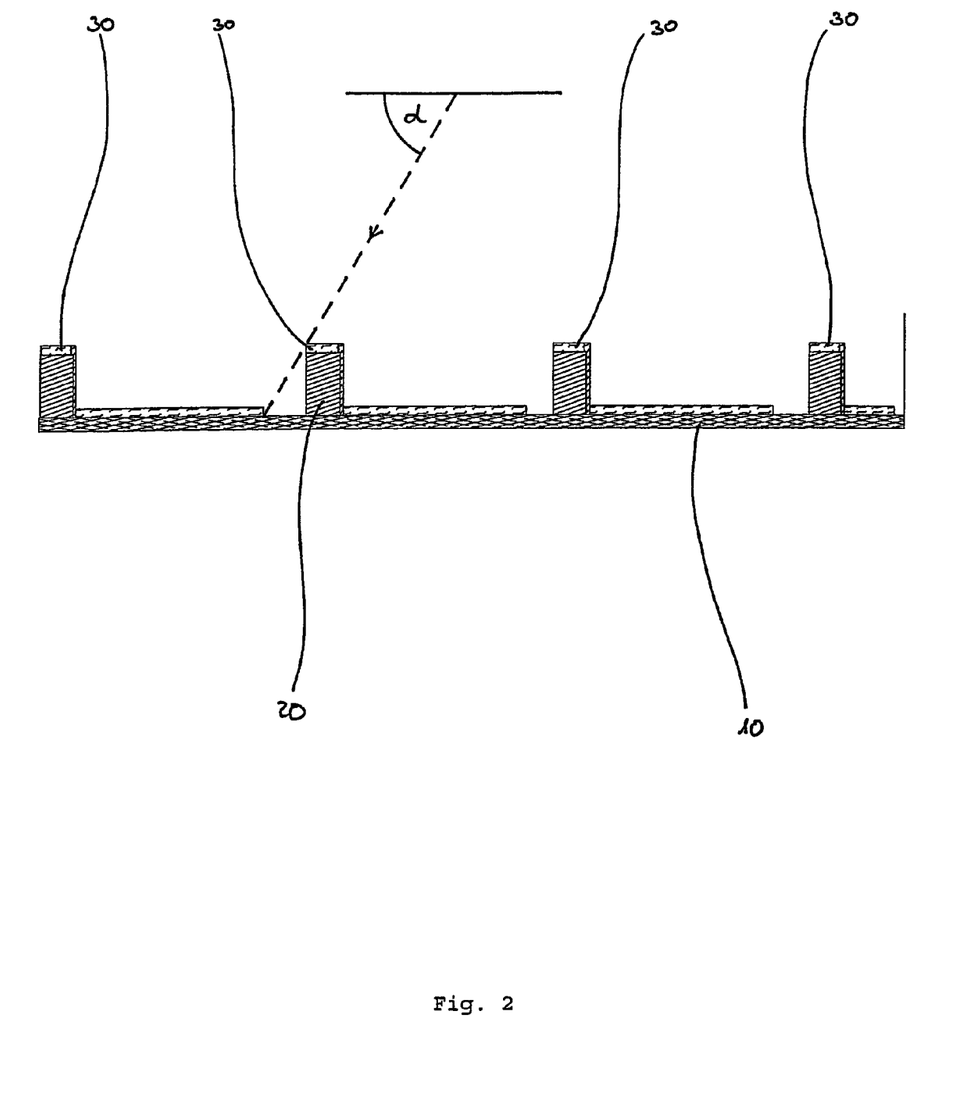
FIG. 2 the application of a first adhesive layer at an angle of incidence α.

FIG. 2 shows an embodiment in which a first main layer 30 is applied onto the substrate 10 and onto the conductor tracks 20 by the process according to the invention. This first layer deposition is carried out at a first angle of incidence α relative to the surface of the substrate and advantageously perpendicular to the lengthwise orientation of the conductor tracks 20. The angle between the lengthwise orientation of the conductor tracks and the direction of the deposition, however, can also diverge from 90°. Here, angles between 90° and 1° are possible.

The targeted application of the adhesive material at an angle α can be done by spraying methods or other suitable methods. As an alternative to application at an angle, it is also possible to use other methods to systematically apply the adhesive layer in such a way that areas without an adhesive layer are formed behind the conductor tracks 20.

The drawing in FIG. 2 shows that, due to the coating at an angle, shaded areas are formed behind the conductor tracks and these areas are thus not exposed to any deposition. Therefore, a coating is created on the tops and flanks of the conductor tracks that are exposed to deposition, as well as on the areas between the conductor tracks that do not lie in the shadow of the conductor tracks. The thickness of the first thin layer applied in this way is typically in the order of magnitude of 50 nm to 50 µm.

This first main layer forms the back contact that advantageously consists of a conductive adhesive. Possible materials for this adhesive can include substances from various polymer classes. Especially suitable materials are, for example, epoxide resins, polyurethanes, and/or polyimides that are provided with suitable conductive particles such as carbon, indium, nickel, molybdenum, iron, nickel chromium, aluminum and/or corresponding alloys or oxides. Another option is intrinsic conductive polymers. These include, for instance, polymers from the group consisting of PAN's.

The selection of the conductive adhesive also depends on the type of semiconductor since an ohmic contact has to exist between the semiconductor and the adhesive. If a selected adhesive has an ohmic contact but a poor layer resistance, then such an adhesive layer can be supported by a previously applied, more conductive, layer. This support layer can, in turn, be sputtered on at an angle. In order to support the adhesive layer, it is also possible to previously apply other adhesives that have a better layer resistance which, even though they do not make an ohmic contact with the semiconductor, they do exhibit good conductivity.

Figure 3:
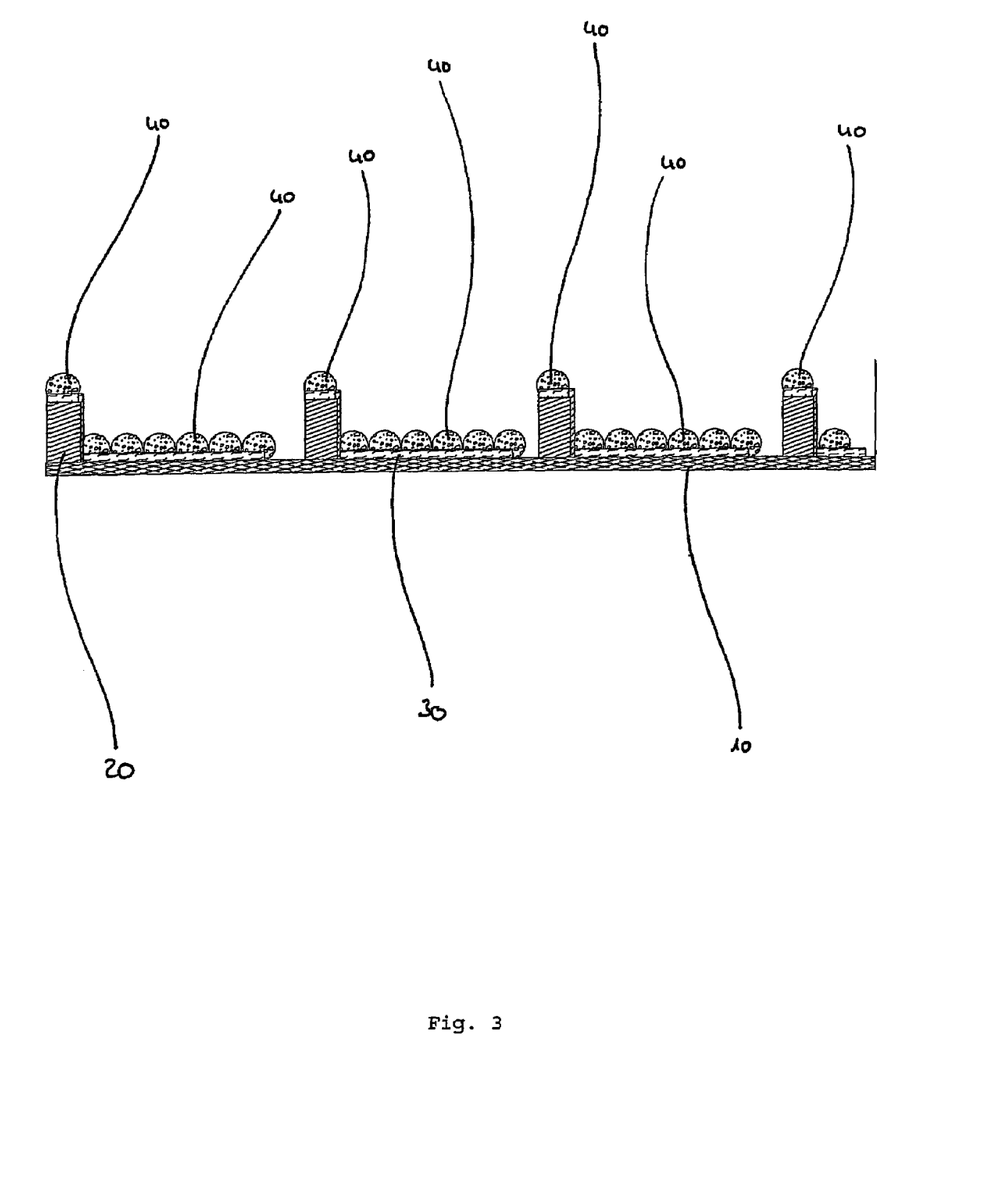
FIG. 3 the application of the semiconductor layer in the form of granular particles.

The drawing in FIG. 3 shows how a semiconductor layer in the form of granular particles 40 is applied. This layer is the second main layer. The grains preferably have a grain size of up to 60 µm and consist of suitable semiconductor materials used in the realm of photovoltaics. In an especially preferred embodiment of the invention, the semiconductor materials are from the class of the II-VI compound semiconductors which include, for example, copper indium diselenide, copper indium disulfide, copper indium gallium diselenide or copper indium gallium diselenide disulfide.

The grains are advantageously applied before the hardening of the first adhesive layer 30 so that the grains adhere there. The grains can be applied onto the substrate, for example, by sprinkling, dusting and/or printing. Grains without contact to the adhesive layer can be removed by suitable methods such as blowing or shaking. Optionally, the adhesive can harden before the removal of these grains. The thickness of the second layer is determined by the diameter of the grains employed, so that typical thicknesses of this main layer lie in the order of magnitude of 10 µm to 200 µm.

The selection of the angle of incidence of the deposition depends on the size of the granular particles that are to be applied later. It has proven to be advantageous to select the application angle α of the first deposition layer 30 in such a way that the shading area behind the conductor tracks 20 corresponds at least to the diameter of one of the grains 40. In this manner, it is ensured that no grains adhere to the shaded side of the conductor track in question and come into contact with the conductor track.

Figure 4:
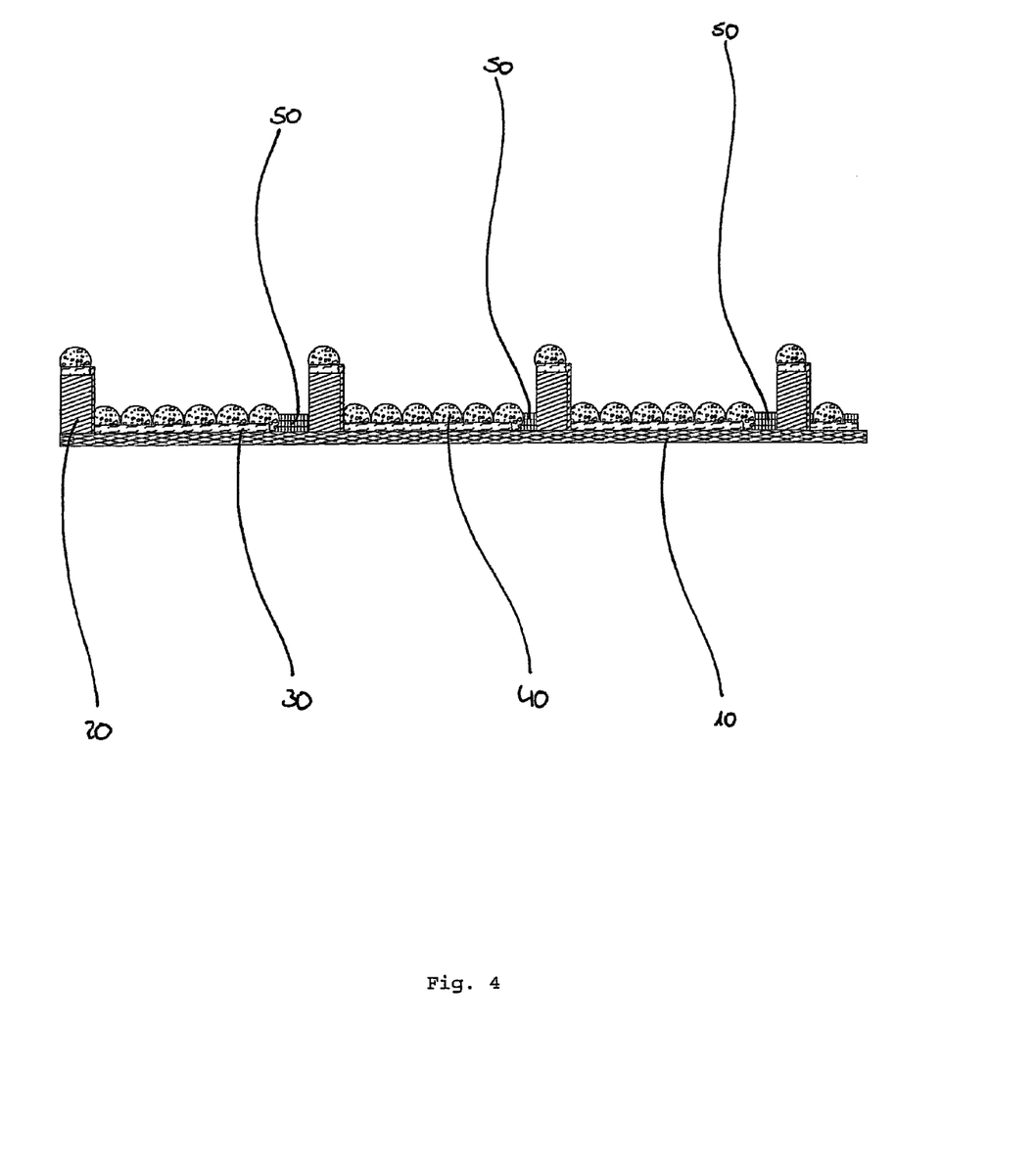
FIG. 4 the application of an insulating layer.

FIG. 4 shows that, as the next process step, an insulating layer 50 is applied onto the substrate, said layer creating an electric insulation in the interstices between the grains 40. This layer preferably consists of a polymer, whereby it can be, for example, a polymer from the group consisting of epoxides, polyurethanes, polyacrylics and/or polyimides. The insulating polymer layer can be applied, for example, by dipping or spraying, and the thickness of this layer is typically in the order of magnitude of 10% to 70% of the grain diameter so that the grains are not covered. For this purpose, the viscosity of the polymer is set in such a way that the material flows freely off the surface of the grains and little material is left behind on the grain surface.

Since the surface of the grains cannot have any insulating polymer on them before the next process step, the residues that remain in spite of the low viscosity have to be removed. This can be done, for instance, by etching with caustic solutions or acids, by plasma etching or by mechanical removal.

Figure 5:
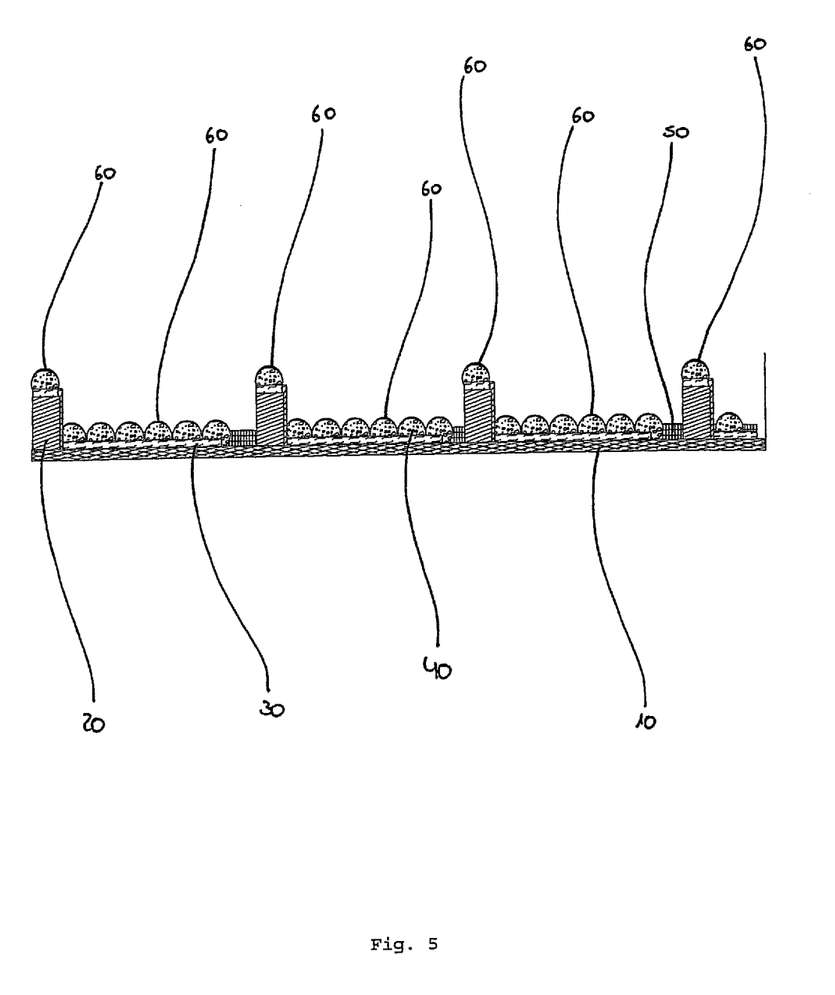
FIG. 5 the application of an n-conductive buffer layer.

FIG. 5 shows how an n-conductive layer 60 is applied in order to create a p/n transition in the next process step. This can be, for example, a cadmium sulfide layer. This layer is a buffer layer that is applied by suitable methods as a function of the selected material. The method of chemical bath deposition is suitable for the application if, for example, cadmium sulfide, In(OH, S) or similar materials are used. Sputtering is suited for other materials such as, for instance, ZnSe and/or ZnTe. Other methods for applying the buffer layer include chemical vapor deposition (CVD), atomic layer deposition (ALD) and ion layer gas reaction (ILGAR).

Figure 6:
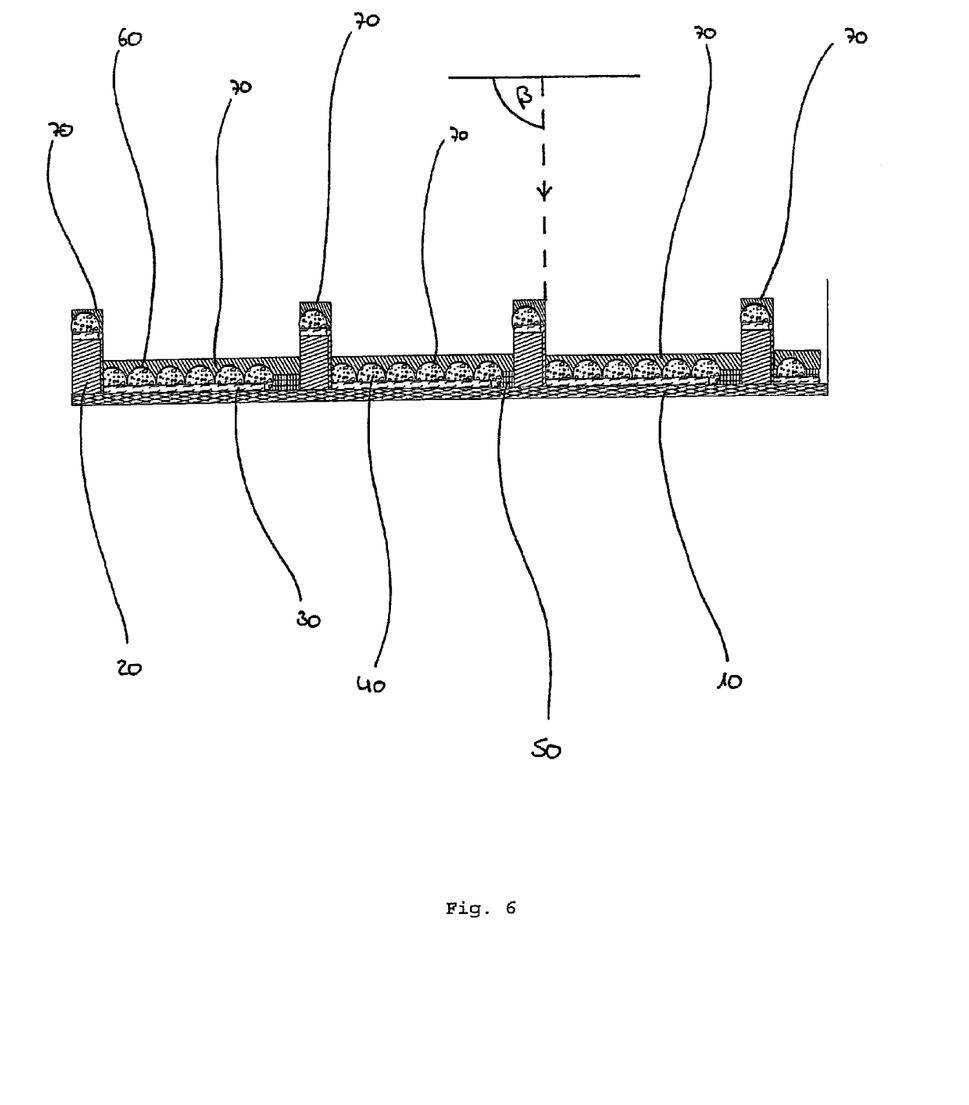
FIG. 6 the application of an intrinsic layer at an angle β.

In an especially preferred embodiment of the invention, in the next process step, which is shown in FIG. 6, an intrinsic layer 70 is applied at an angle β relative to the surface of the substrate. This is preferably ZnO. Once again, suitable application methods for this third step include sputtering, CVD, ALD or ILGAR. It has proven to be advantageous to select the angle β in such a way that the flanks of the conductor tracks that were shaded in the first process step of the layer 30 are likewise not coated now. However, the angle should diverge only slightly from 90° so that typical angles lie in the order of magnitude of 70° to 89° relative to the surface of the substrate. The drawing of FIG. 6 shows an angle β of 90°.

Figure 7:
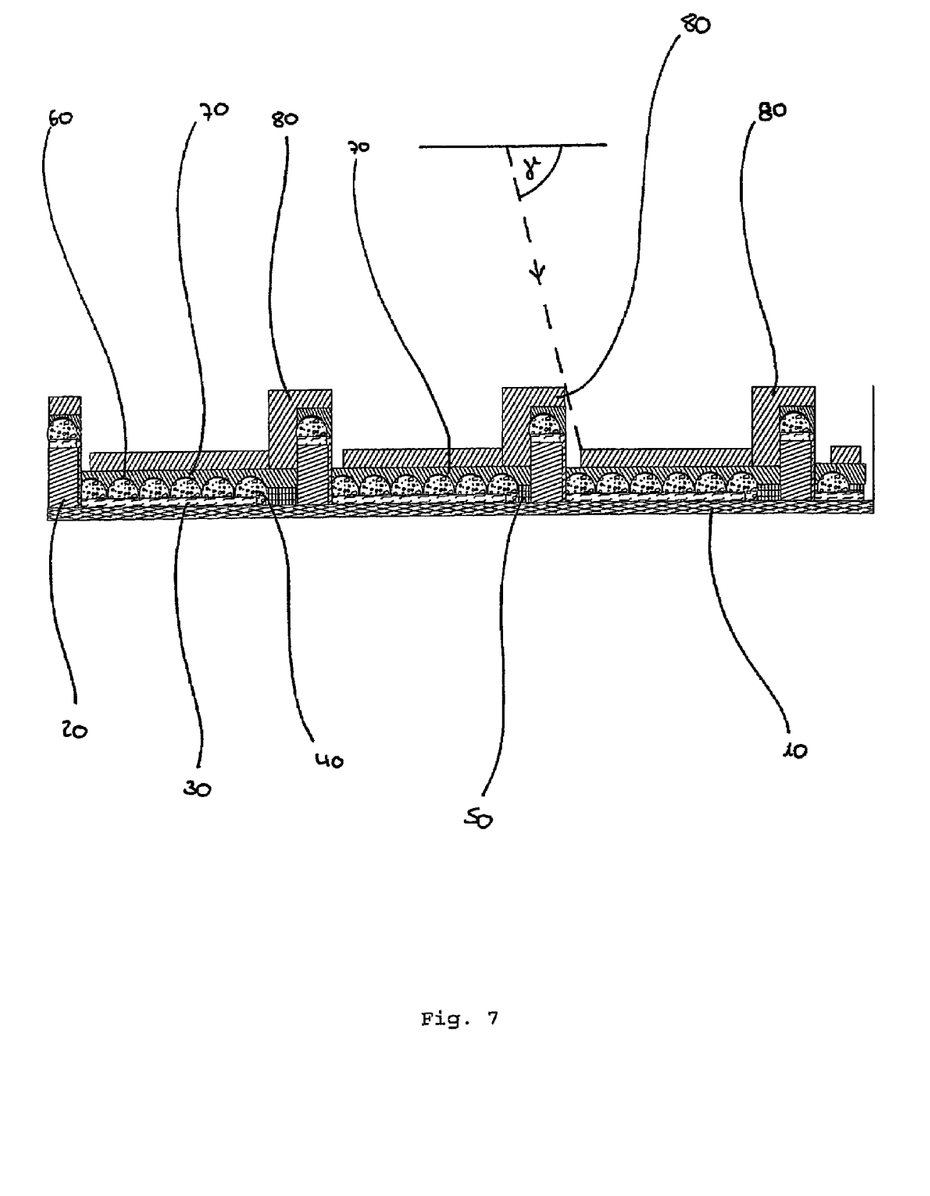
FIG. 7 the application of a front contact at an angle γ.
Figure 8:
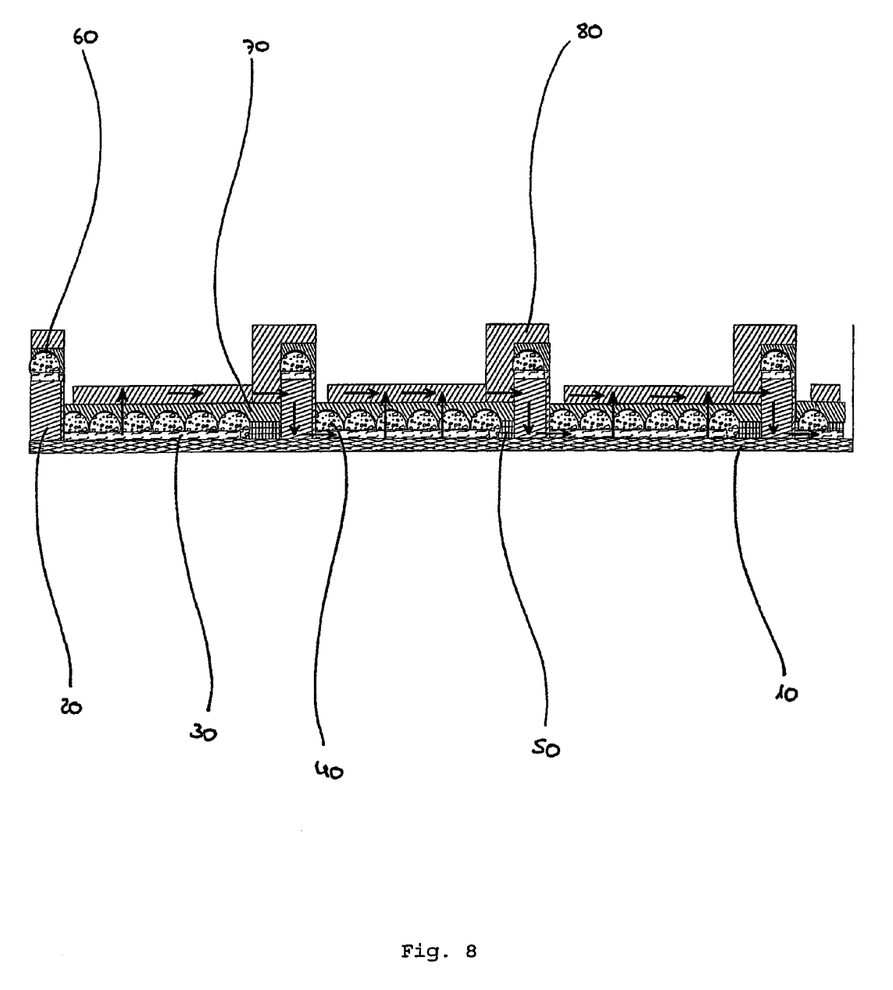
FIG. 8 the current course in the resultant serial connection of the thick and thin layers.

The drawing in FIG. 7 shows how, as the last process step, the coating is carried out with a conductive front contact 80 at an angle γ relative to the surface of the substrate. This fourth main layer can also be applied with methods such as sputtering or CVD. Suitable materials for the front contact can be, for example, various TCOs (transparent conductive oxides). The angle γ is preferably inverse to the angle α so that the flanks that were not yet coated are now exposed to a deposition.

The process is now complete and the resulting layers constitute a serial connection that can be used, for example, for solar cells. In FIG. 7, a set of arrows shows the current course.

LIST OF REFERENCE NUMERALS 10 substrate
20 electrically conductive conductor tracks
30 adhesive layer at an application angle α
40 semiconductor layer made of granular particles
50 insulation layer
60 n-conductive buffer layer
70 intrinsic layer at an application angle β
80 front contact layer at an application angle γ

The invention claimed is:

1. A method for the production of self-adjusting serial connections of thick and/or thin layers, characterized by the following process steps:

electrically conductive conductor tracks are applied onto a substrate;

a first main layer of a conductive adhesive material is applied at an angle α relative to the surface of the substrate;

a second main layer of granular particles, which adhere to the first main layer, is applied onto the substrate;

several layers are applied;

a third main layer is applied at an angle β relative to the surface of the substrate; and a fourth main layer is applied at an angle γ relative to the surface of the substrate, whereby the angles α and γ are different from 90° and are inverse to each other.

2. The method according to claim 1, characterized in that the targeted application of the main layers is carried out at an angle by means of a PVD process.

3. The method according to claim 1, characterized in that, in order to form the main layers, the flux direction of the applied material particles runs perpendicular to the orientation of the conductor tacks.

4. The method according to claim 1, characterized in that the electrically conductive conductor tracks are applied onto the substrate by means of silk screen printing.

5. The method according to claim 1, characterized in that graphite and/or silver paste is used to apply the electrically conductive conductor tracks by means of silk screen printing.

6. The method according to claim 1, characterized in that the electrically conductive conductor tracks are glued onto the substrate by means of a conductive adhesive.

7. The method according to claim 1, characterized in that the granular particles of the second main layer are applied by sprinkling, dusting and/or printing.

8. The method according to claim 1, characterized in that the application angle α of the first main layer is selected in such a way that, depending on the height H and the width W of the conductor tracks, the shading area on the flanks of the conductor tracks is at least as wide as the diameter of the granular particles.

9. The method according to claim 1, characterized in that, after the granular particles, an insulating layer is applied that covers 10% to 70% of the granular particles.

10. The method according to claim 9, characterized in that the insulating layer is applied by dipping or spraying.

11. The method according to claim 9, characterized in that material of the insulating layer is removed from the surfaces of the granular particles.

12. The method according to claim 9, characterized in that material of the insulating layer is removed from the surfaces of the granular particles by etching methods.

13. The method according to claim 9, characterized in that material of the insulating layer is removed from the surfaces of the granular particles mechanically.

14. The method according to claim 9, characterized in that, after the application of the insulating layer, a p/n transition is created.

15. The method according to claim 14, characterized in that, after the application of the insulating layer, an n-conductive buffer layer is applied.

16. The method according to claim 1, characterized in that the application angle β of the third main layer is about 70° to 89°.

17. The method according to claim 15, characterized in that the first, third and fourth main layers and the insulating layer and n-conductive buffer layer are applied by means of sputtering, CVD, ALD and/or ion layer gas reaction (ILGAR) methods and/or by chemical bath deposition.

18. A serial connection of thick andlor thin layers, characterized in that they were made by the process steps described in claim 1.

19. The serial connection according to claim 18, characterized in that the substrate is made of glass.

20. The serial connection according to claim 19, characterized in that the substrate is made of float glass.

21. The serial connection according to claim 18, characterized in that the substrate is made of polymer film.

22. The serial connection according to claim 18, characterized in that the electrically conductive conductor tracks run essentially parallel to each other.

23. The serial connection according to claim 19, characterized in that the dimensions of the electrically conductive conductor tracks are about length L =30 cm to 6 meters, height H=5 μm to 500 μm and width W=10 μm to 500 μm.

24. The serial connection according to claim 18, characterized in that there are 50 to 200 conductor tracks per meter on the surface of the substrate.

25. The serial connection according to claim 18, characterized in that the conductor tracks are made of conductive polymer compounds, conductive glass frits or metallic wires.

26. The serial connection according to claim 18, characterized in that the first main layer is a conductive adhesive layer.

27. The serial connection according to claim 26, characterized in that the main component of the first main layer is from the group consisting of polymers.

28. The serial connection according to claim 27, characterized in that the main component of the first main layer is from the group consisting of epoxide resins, polyurethanes, polyacrylics and/or polyimides.

29. The serial connection according to claim 27, characterized in that the main component of the first main layer is from the group consisting of intrinsic conductive polymers (PAN's).

30. The serial connection according to claim 18, characterized in that the granular particles of the second main layer are made of semiconductive material.

31. The serial connection according to claim 30, characterized in that the diameter of the granular particles is up to 60 μm.

32. The serial connection according to claim 18, characterized in that the granular particles are made of photovoltaic semiconductor materials.

33. The serial connection according to claim 18, characterized in that the granular particles are made of materials from the class of II-VI compound semiconductors.

34. The serial connection according to claim 18, characterized in that the granular particles are made of materials from the group consisting of copper indium diselenide, copper indium disulfide, copper indium gallium diselenide andlor copper indium gallium diselenide disulfide.

35. The serial connection according to claim 18, the process steps further characterized in that, after the granular particles, an insulating layer is applied that covers 10% to 70% of the granular particles, the serial connection characterized in that the insulating layer is made of a polymer.

36. The serial connection according to claim 35, characterized in that the main component of the insulating layer is a polymer from the group consisting of epoxide resins, polyurethanes, polyacrylics andlor polyimides.

37. The serial connection according to claim 18, the process steps further characterized in that, after the granular particles, an insulating layer is applied that covers 10% to 70% of the granular particles, and after the application of the insulating layer, an n-conductive buffer layer is applied, the serial connection characterized in that the n-conductive buffer layer is made of cadmium sulfide, ZnSe or ZnTe.

38. The method according to claim 18, characterized in that the third main layer is made of ZnO.

39. The method according to claim 18, characterized in that the fourth main layer farms a front contact.

40. The method according to claim 39, characterized in that the fourth main layer is made of a TCO (transparent conductive oxide).

* * * * *